United States Patent
Chen et al.

(10) Patent No.: US 7,500,214 B2
(45) Date of Patent: Mar. 3, 2009

(54) SYSTEM AND METHOD FOR REDUCING DESIGN CYCLE TIME FOR DESIGNING INPUT/OUTPUT CELLS

(75) Inventors: Ker-Min Chen, Hsin-Chu (TW); Ming-Hsiang Song, Shin-Chu (TW); Chang-Fen Hu, Pan-Chao (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 390 days.

(21) Appl. No.: 11/381,042

(22) Filed: May 1, 2006

(65) Prior Publication Data

US 2006/0195811 A1      Aug. 31, 2006

Related U.S. Application Data

(62) Division of application No. 10/444,907, filed on May 22, 2003, now Pat. No. 7,062,740.

(51) Int. Cl.
*G06F 17/50* (2006.01)
(52) U.S. Cl. .......................................................... 716/17
(58) Field of Classification Search .................... 716/17
See application file for complete search history.

(56) References Cited

U.S. PATENT DOCUMENTS

| | | | | |
|---|---|---|---|---|
| 4,849,904 A | * | 7/1989 | Aipperspach et al. | 716/17 |
| 5,208,764 A | * | 5/1993 | Rusu et al. | 716/8 |
| 5,406,497 A | * | 4/1995 | Altheimer et al. | 716/6 |
| 5,552,333 A | * | 9/1996 | Cheung et al. | 438/129 |
| 5,777,354 A | | 7/1998 | Cheung et al. | |
| 5,987,086 A | * | 11/1999 | Raman et al. | 716/1 |
| 5,999,726 A | | 12/1999 | Ho | |
| 6,057,169 A | * | 5/2000 | Singh et al. | 438/14 |
| 6,075,934 A | | 6/2000 | Chiluvuri et al. | |
| 6,446,250 B1 | | 9/2002 | Becker | |
| 6,457,157 B1 | | 9/2002 | Singh et al. | |
| 6,550,047 B1 | | 4/2003 | Becker | |
| 6,708,144 B1 | * | 3/2004 | Merryman et al. | 703/14 |
| 6,829,753 B2 | | 12/2004 | Lee et al. | |

FOREIGN PATENT DOCUMENTS

JP         11039887 A         2/1999

* cited by examiner

*Primary Examiner*—Jack Chiang
*Assistant Examiner*—Brandon W Bowers
(74) *Attorney, Agent, or Firm*—Duane Morris LLP

(57) ABSTRACT

I. A method and system is disclosed for generating a desired input/output (I/O) cell based on a basic cell from a library. After identifying a configuration requirement for a desired I/O cell to be used for an integrated circuit design, at least one basic cell is selected, the basic cell having a base component for generating the desired I/O cell to meet the configuration requirement. A connection template is generated having one or more programmable connection points identified thereon, the programmable connection points identifying locations for making connections to one or more feature components of the basic cell. The selected basic cell and the connection template are combined to generate a design file, wherein the design file corresponds to the desired I/O cell with the predetermined feature components of the basic cell integrated with the basic component to satisfy the configuration requirement. The disclosed method reduces the design cycle-time as well as circuit-library maintenance and update effort.

20 Claims, 7 Drawing Sheets

SYSTEM AND METHOD FOR REDUCING DESIGN CYCLE TIME FOR DESIGNING INPUT/OUTPUT CELLS

This application is a division of application Ser. No. 10/444,907 filed May 22, 2003, the entirety of which is incorporated by reference herein.

BACKGROUND OF THE DISCLOSURE

The present disclosure relates generally to integrated circuit (IC) design, and more particularly to an improved method for designing input/output (I/O) cells for use in semiconductor ICs.

A basic component of an integrated circuit (IC) is the input/output (I/O) cell. A semiconductor chip generally has a core region located at a center region on the chip and I/O cells are placed around the periphery of the core region.

Devices in different IC packages are connected to one another at various I/O pads. The I/O pads are the connection points to the I/O cell. Depending on the need of the design, the I/O cell can be an input only cell, output only cell, or a bi-directional cell. The I/O cell may sense the logic state of signals applied to the I/O pad or may generate a logic state signal to be sensed. To correctly and efficiently interface with other IC packages or electrical devices, an I/O cell may take many forms.

Other electrical circuits might generate signals, and these signals may interact with the I/O cell. The I/O cell may be required to buffer, latch, pull-up, pull-down, or otherwise condition the signals. Alternatively, an I/O cell may provide an electrical signal to be sensed by external electrical circuits or IC packages. The I/O cell may be required to increase the driving strength of an output signal, or may pull-up, pull-down, or otherwise condition the signal. Additionally, bi-directional I/O cells may be used both for sensing input signals and generating output signals.

The design of IC packages can be accomplished manually or with the aide of various automated design tools. The layout and design of the I/O cells can also be designed with similar tools. To simplify the process and reduce time and cost, designed I/O cells are stored in libraries for reuse. The designer may search the library for an I/O cell design that satisfies specified performance requirements.

Although some optimization is provided by the use of pre-designed I/O cells in the library, the library may only provide a limited number of I/O cell for design options. To satisfy broadening demands for making various I/O cells, additional design effort is required to create new designs or integrate existing I/O cell designs. Additionally, to accommodate the ever expanding performance requirements, library entries are growing rapidly in number and complexity, making the creation and maintenance an I/O library significantly more time consuming.

What is needed is an improved method and system for generating I/O cells to reduce the design cycle time.

SUMMARY OF THE DISCLOSURE

As the variety of IC's grows and performance demands change, designing I/O cells has become cumbersome. An improved method and system is disclosed for generating a desired input/output (I/O) cell based on a basic cell from a library. After identifying a configuration requirement for a desired I/O cell to be used for an integrated circuit design, at least one basic cell is selected, the basic cell having a base component that helps to generate the desired I/O cell to meet the configuration requirement. A connection template is generated having one or more programmable connection points identified thereon, the programmable connection points identifying locations for making connections to one or more feature components of the basic cell. The selected basic cell and the connection template are combined to generate a design file, wherein the design file corresponds to the desired I/O cell with the predetermined feature components of the basic cell integrated with the basic component to satisfy the configuration requirement. The disclosed method reduces the design cycle time as well as circuit library maintenance and update effort.

Various aspects and advantages of the disclosed method and system for designing an I/O cell will become apparent from the following detailed description, taken in conjunction with the accompanying drawings, illustrating by way of example the principles of the disclosure.

DETAILED DESCRIPTION

Figure 1:
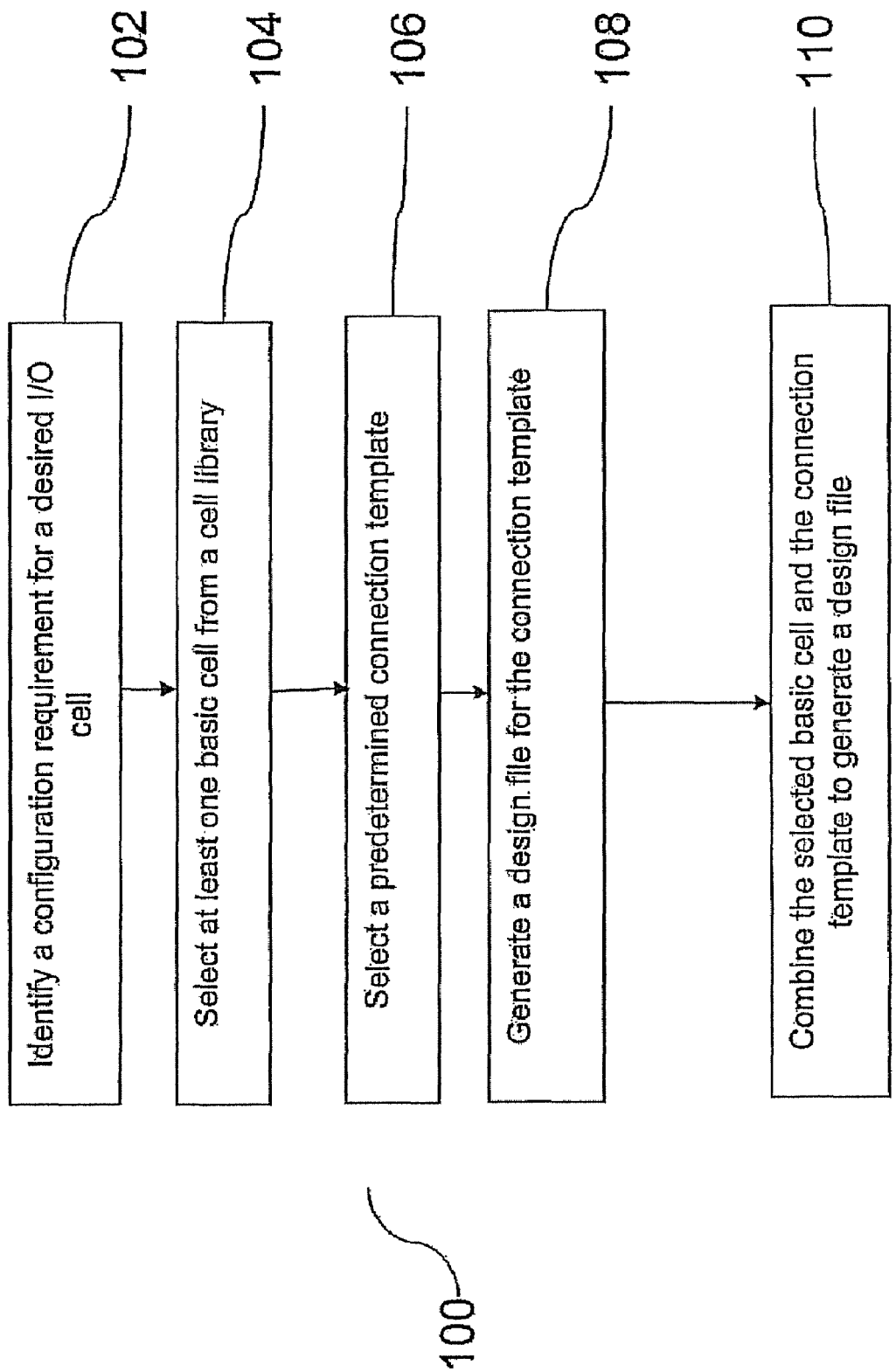
FIG. 1 illustrates a flow diagram for designing a desired I/O cell according to one example of the present disclosure.

The present disclosure provides an improved method and system for providing appropriate I/O cells for an integrated circuit design. A basic cell is used as a base for designing a desired I/O cell. The basic cell has a core component and certain feature components connectable through certain programmable connection points. By identifying and placing certain programmable connection points on the basic cell, the core component is integrated with selected feature components so that the configuration requirement of the desired I/O cell is satisfied.

Unless custom designed, pre-designed I/O cells are generally provided as part of a cell library. I/O cells are preferably generated to meet desired requested physical characteristics as well as performance characteristics. Those expected characteristics are generally referred to as a configuration requirement for a particular I/O cell. For example, the I/O cells are designed to meet the tolerance parameter and a drive strength parameter. Additionally, the I/O cell selection may have to fit within a predetermined size (i.e., width and length) parameter. The selection of the pre-designed I/O cells also includes the design of P-tap regions, N-tap regions, isolation ring regions, and a receiver pre-driver region. In short, designing an I/O cell is no different from designing any other component of a circuit. Blocks of circuitry represented as standard designs in circuit libraries, commonly known as macro blocks, can be considered as building blocks for use in various circuit designs.

According to the present disclosure, an I/O cell library is built on a basic cell, whose physical characteristics may be pre-designed based on a predetermined design requirement. For instance, based on the request of a customer, design engineers may have to create an I/O basic cell that is 50 microns wide. The new cell library may also include components designed with a predetermined design rule. The elements might include structures of a pad, an inverter, a NOR circuit, and so on formed with a predetermined design rule. On the other side, another customer may require a basic cell having a width of 80 microns. The 80 microns wide cell may have a separate library built on a basic cell with an 80 microns cell width.

Once the basic cell is constructed, it contains a core component and a number of feature components. The core component may be detached from the feature components initially. There are connection points on the basic cell that connect one element to another such as via, metal line, poly line, etc. Among these connection points, a number of them are programmable. That is, the locations of the connection points can be identified, and the connection points can be made or removed there, which effectively connect or disconnect certain components on the basic cell. For the purpose of this disclosure, the programmable connection points refer to those that can connect the core component with the feature components. It is further assumed that all connection points on the core component itself, other than those potentially connectable to the feature components, are not programmable.

The feature components are to provide certain circuit features for the I/O cell. For example, by connecting to certain feature components, the core component along with the connected feature components makes the I/O cell an input only I/O cell. Similarly, certain feature components may turn the I/O cell into an output only cell or a bi-directional cell. Other feature components may provide connections to design, modify, or adjust the I/O cell with Schmitt trigger, pull-up/pull-down, input enable, bus holder, slew rate control, and driving strength features.

Figure 2:
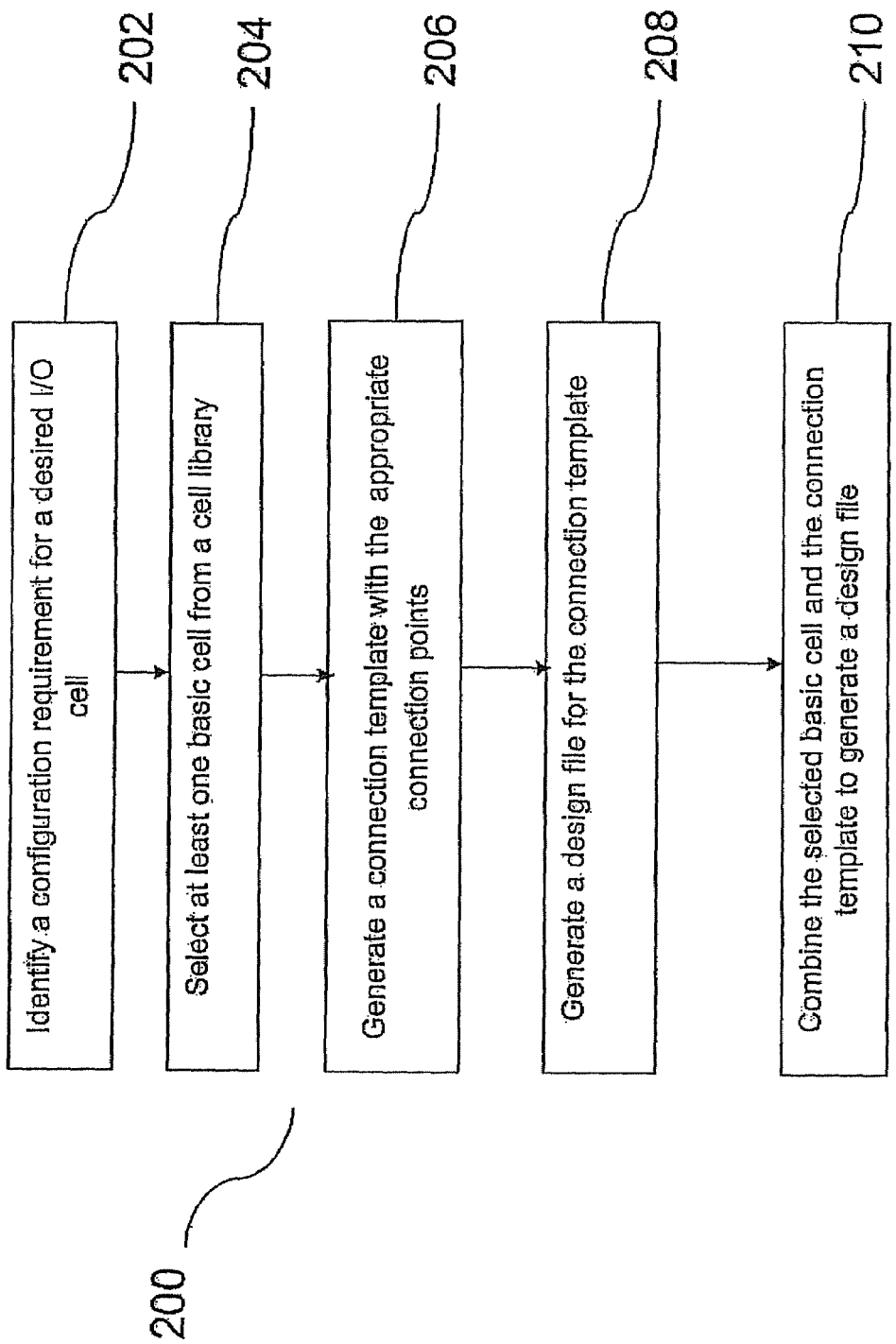
FIG. 2 illustrates a flow diagram for designing a desired I/O cell according to another example of the present disclosure.
Figure 3:
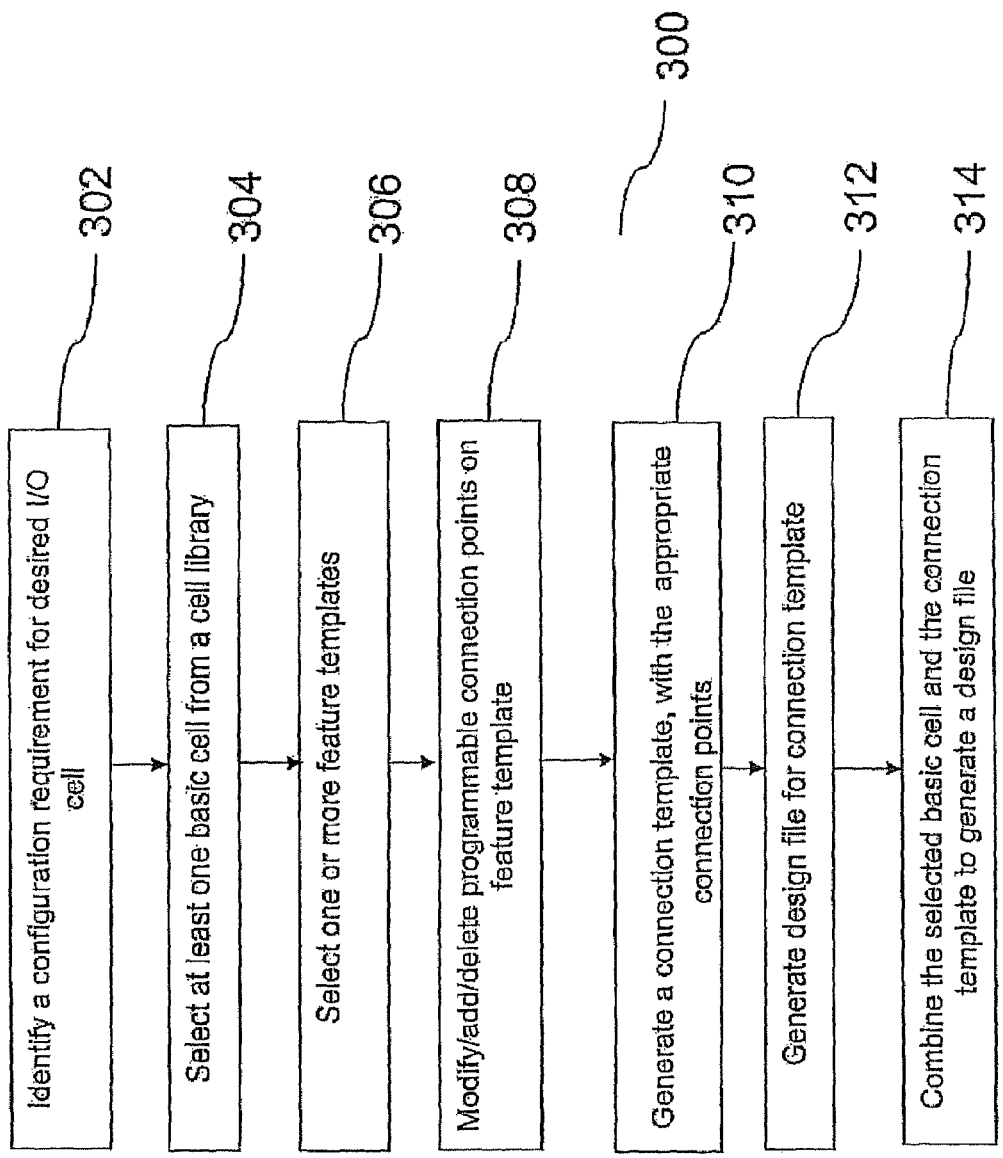
FIG. 3 illustrates a flow diagram for designing a desired I/O cell according to an additional example of the present disclosure.

FIG. 1, FIG. 2, and FIG. 3 illustrate some examples for designing a desired I/O cell according to several examples of the present disclosure.

In FIG. 1, the first step (102) is to identify a configuration requirement for a desired I/O cell. This cell would be used for an integrated circuit chip design. The configuration requirement may include the physical size of the cell and the specific features that the desired cell should normally include such as a particular driving strength needed. In essence, the configuration requirement has all the specifications for the finished I/O cell. This configuration requirement may be dictated by a customer or a design group. In step 104, at least one basic cell is selected from a cell library. It is assumed that the basic cell has been designed and available in the library as it is understood in the industry that certain standard cells are used frequently for different designs. The I/O basic cell is selected from the library based on certain features such as its physical size. The basic cell being selected has a base component which is a starting point for generating the desired I/O cell. In addition to the core component, the basic cell may have all available feature components designed thereon. However, at this point, the basic cell may not be functional, and has a number of "floating" feature components.

The configuration requirement presents all performance and parameter requirements for the I/O cell. The configuration requirement may require the I/O cell to have a pure input, pure output, bi-directional, slew rate control, pull-up/down, input enable, Schmitt trigger, or a bus holder feature. Other features that might also be required by the configuration requirement may include, for example, requirement to buffer and condition signals in and out of the core region, provide minimum levels of electrostatic discharge (ESD) protection, have transistors that can withstand selected voltage tolerances, and to meet the driving strength requirement. To design the desired I/O cell, one or more features are then clearly identified based on the configuration requirement.

In order to make connections to certain feature components, at the design layout stage, a connection template is then developed. The connection template has one or more programmable connection points identified thereon, and when superimposed on the basic cell, it will be graphically shown that the programmable connection points connect certain feature components to provide the features needed for the desired I/O device. In one example, the designer can pre-design a number of such connection templates based on possible combination of these available features. If an appropriate connection template is available for selection, it is selected in step 106 to match the configuration requirement. The connection template is then compiled into an appropriate design file in step 108. Since the selected basic cell has its own design file, it will be merged with the design file for the connection template in step 110 to generate one or more design files in an unambiguous representation that describes the layout of the desired I/O cell. The merged design will have selected feature components connected to the core component through the placed programmable connection points to satisfy the configuration requirement.

There are multiple methods for developing the connection template. FIG. 2 and FIG. 3 illustrate alternatives to design a desired I/O cell using a basic cell with a connection template. Regardless of the method used, the connection template will have one or more programmable connection points identified.

FIG. 2 illustrates an alternative method for designing the I/O cell according to one example of the present disclosure. As in FIG. 1, the first step 202 is to identify at least one configuration requirement for a desired I/O cell. The next step 204 is to select at least one basic cell from a cell library.

In step 206, instead of selecting one from a group of available connection templates, a new connection template might be generated dynamically based on the selected basic cell and the desired I/O cell's configuration requirement. It can be ascertained that certain connection points are programmable, and certain programmable connection points are associated with certain feature components. As such, all the programmable connection points may be available for selection, and included on a dynamically generated connection plate.

Similar to FIG. 1, through steps 208 and 210, the selected basic cell and the connection template are then combined to generate one or more design files to represent the layout of the desired I/O cell.

FIG. 3 illustrates another alternative method for designing the I/O cell. As in FIG. 1, the steps 302 and 304 identify at least one configuration requirement for a desired I/O cell and select at least one basic cell from a cell library, respectively. In step 306, one or more feature templates could be selected. Feature templates are predetermined connection templates, each being specifically designed with programmable connection points thereon and associated with a predetermined I/O feature. If the library makes 7 features available for design, there will be 7 feature templates. These feature templates can then be imposed over the basic cell one after another to identify different programmable connection points. Additionally, once the feature templates are selected for the desired I/O cell, they might be modified to meet specific requirements by having connection points added or deleted in step 308. As such, in step 310, a new connection template might be generated from the selected feature templates and the I/O cell's configuration requirement is satisfied.

In steps 312 and 314, the selected basic cell and the connection template are then combined to generate one or more design files to represent the layout of the desired I/O cell.

Figure 4:
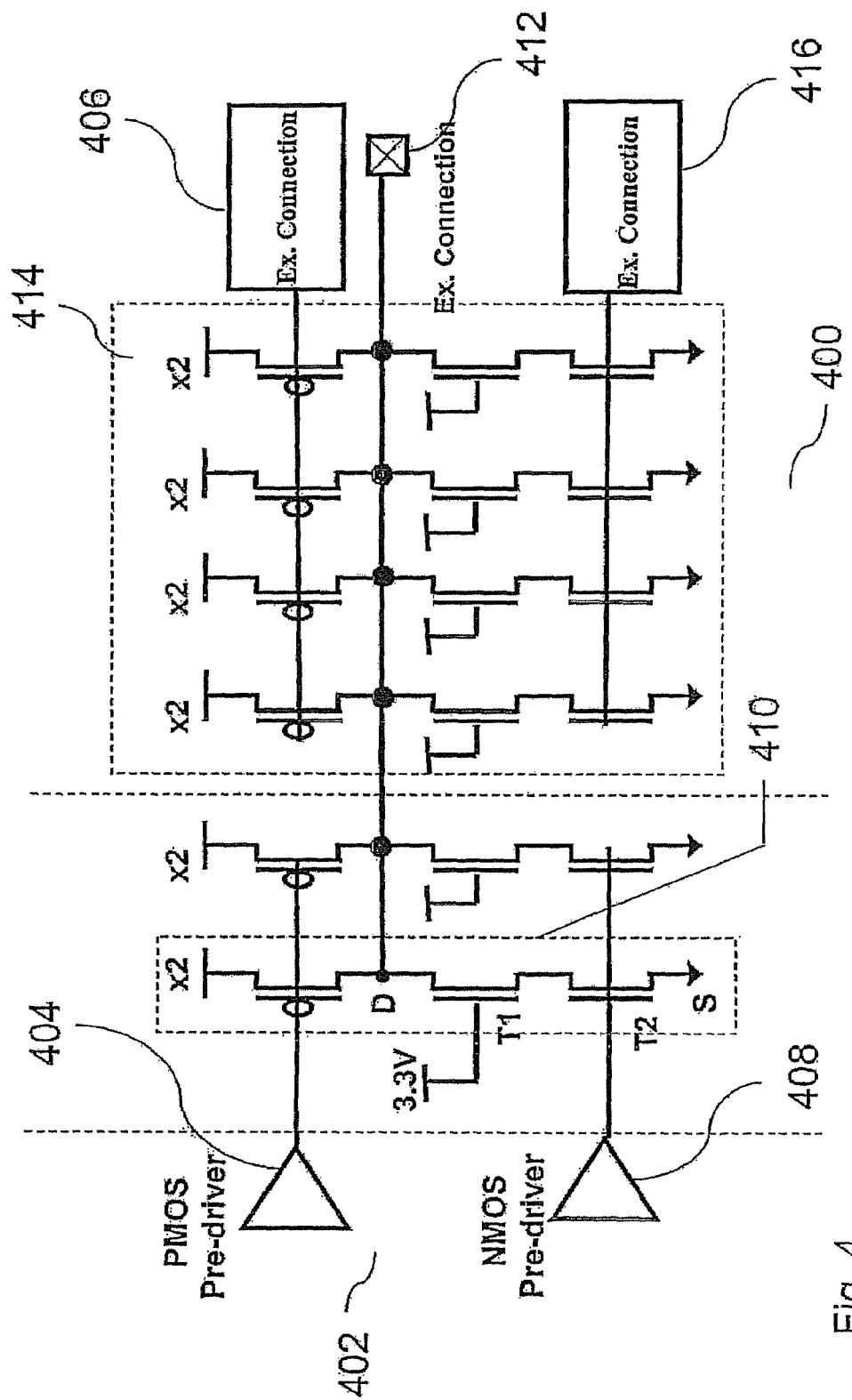
FIG. 4 illustrates a circuit schematic for a sample I/O cell.

FIG. 4 illustrates a schematic diagram of a portion of a sample I/O circuit 400. The circuit includes, a pre-driver region 402 with a PMOS pre-driver 404 connected to the gates of two PMOS transistors. Each group of three transistors (with one PMOS transistor on the top of two NMOS transistors) connected in series vertically is known as a "finger". Each finger gives the I/O additional driving strength in terms of electrical current. The gates of the PMOS transistor of other four fingers are connected to an external connection 406 such as an ESD circuit. Taking the leftmost finger 410 for illustration, it includes two NMOS transistors connected in series (T1 and T2), and an NMOS pre-driver 408 connects to the finger 410 through the gate of T2. The gate of T1 is connected to a predetermined voltage source such as a 3.3 V power source. The source portion (S) of T2 is grounded, and the drain portion of T1 (D) is connected with other fingers to an external connection pad 412. The four fingers 414 shown on the right are additional programmable ones that are added based on the driving strength requirement. The gates of the bottom NMOS transistor are also connected to an external connection 416. What is shown in FIG. 4 is only a portion of the I/O cell, but it is representative enough to illustrate examples described above. By selecting a predetermined number of programmable connection points, the four fingers 414 can be activated in the basic cell to become functional. It is noticed that each finger shown in FIG. 4 actually is duplicated (as indicated by "×2") so that there are altogether 12 fingers in this circuit.

Figure 5:
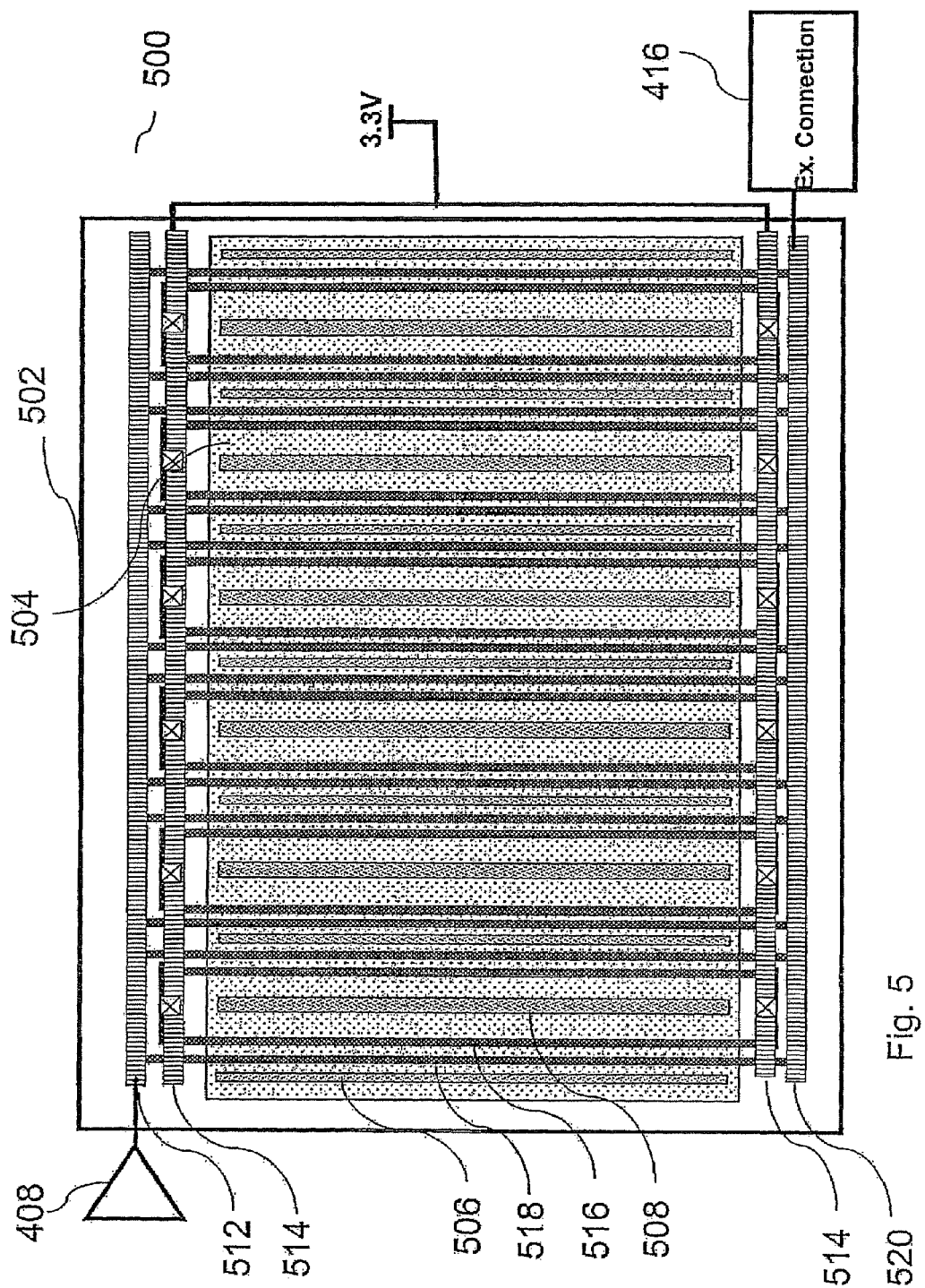
FIG. 5 illustrates a layout of a portion of a basic I/O cell corresponding to a portion of the sample I/O cell of FIG. 4.

FIG. 5 illustrates a sample layout of a portion of a basic I/O cell 500. This cell might be selected to satisfy the configuration requirements of the circuit in FIG. 4. Only the NMOS components of FIG. 4 are illustrated here in FIG. 5. The mask layout as illustrated is compiled in a well known GDSII format.

The basic cell 500 illustrated in FIG. 5 is illustrated within a boundary frame 502. An active area 504 is in the center, and source and drain lines 506 and 508 are developed at selected locations within the active area. The NMOS pre-driver 408 aligns with a poly line 512 on the top. Two poly lines 514 connect to the gates of T1s 516 and further connects to the 3.3V source. A multiplicity of gates are in between the source and drain lines to construct to NMOS transistors T1 and T2 connected in a series. The gate of T2 518 is between the gate of T1 516 and the source line 506. A bottom poly line 520 aligns with the external connection 416. At this moment, altogether the NMOS part of all 12 fingers are there in the basic cell, but are "floating." Connecting the components can complete the I/O circuit. This is accomplished when the basic cell and the connection template are merged.

Figure 6:
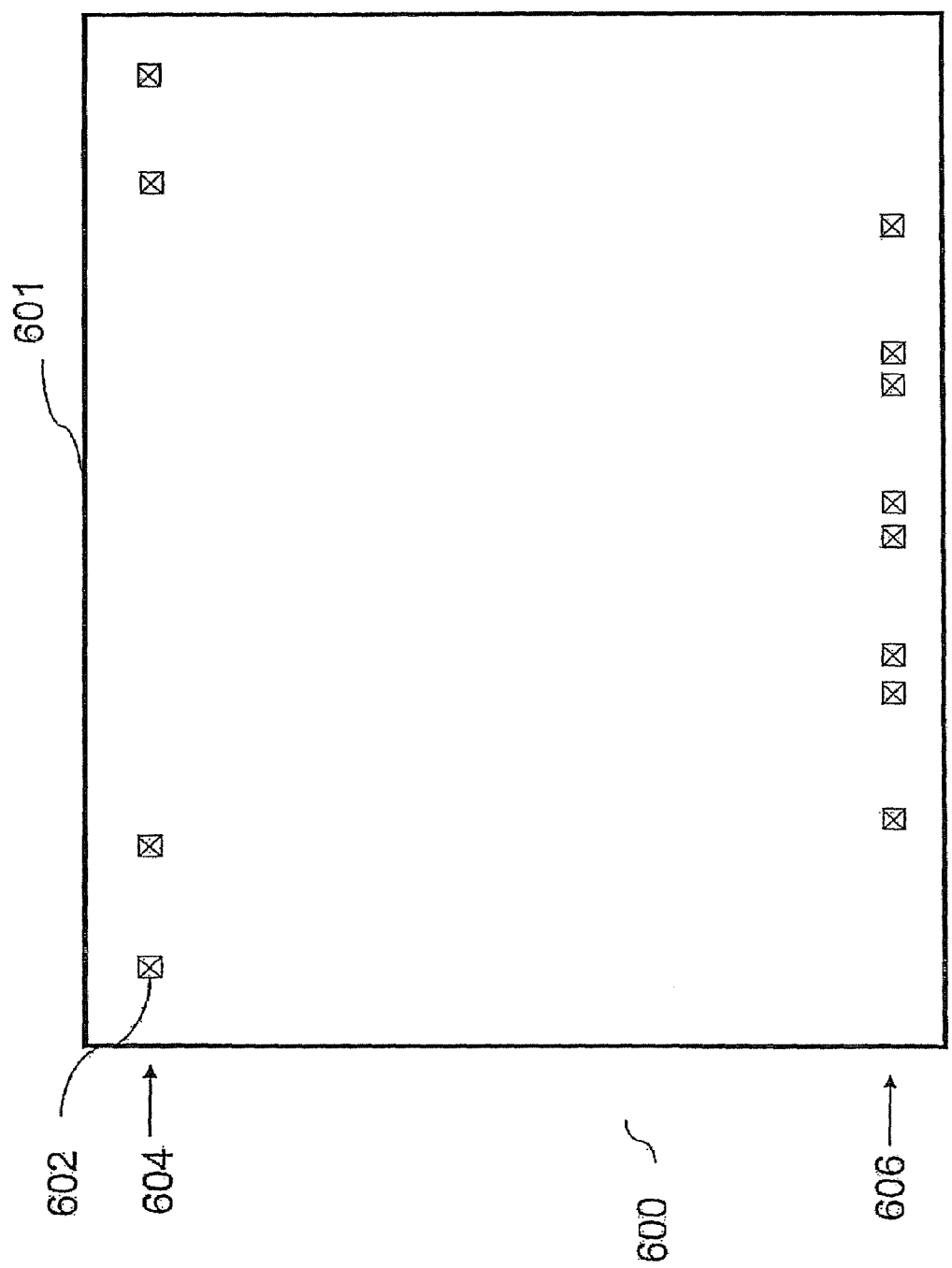
FIG. 6 illustrates a number of programmable contacts of the basic I/O cell of FIG. 4.

FIG. 6 illustrates the connection template 600 generated to configure the NMOS side of the circuit described in FIG. 5. The boundary of the connection template 601 aligns with the boundary 502 of FIG. 5. The template has a total of 12 connection points 602. Four connection points 604 on top will connect the pre-driver to the driving fingers, and eight connection points 606 at the bottom will connect the other fingers 414. Their purpose will be further illustrated in FIG. 7.

Figure 7:
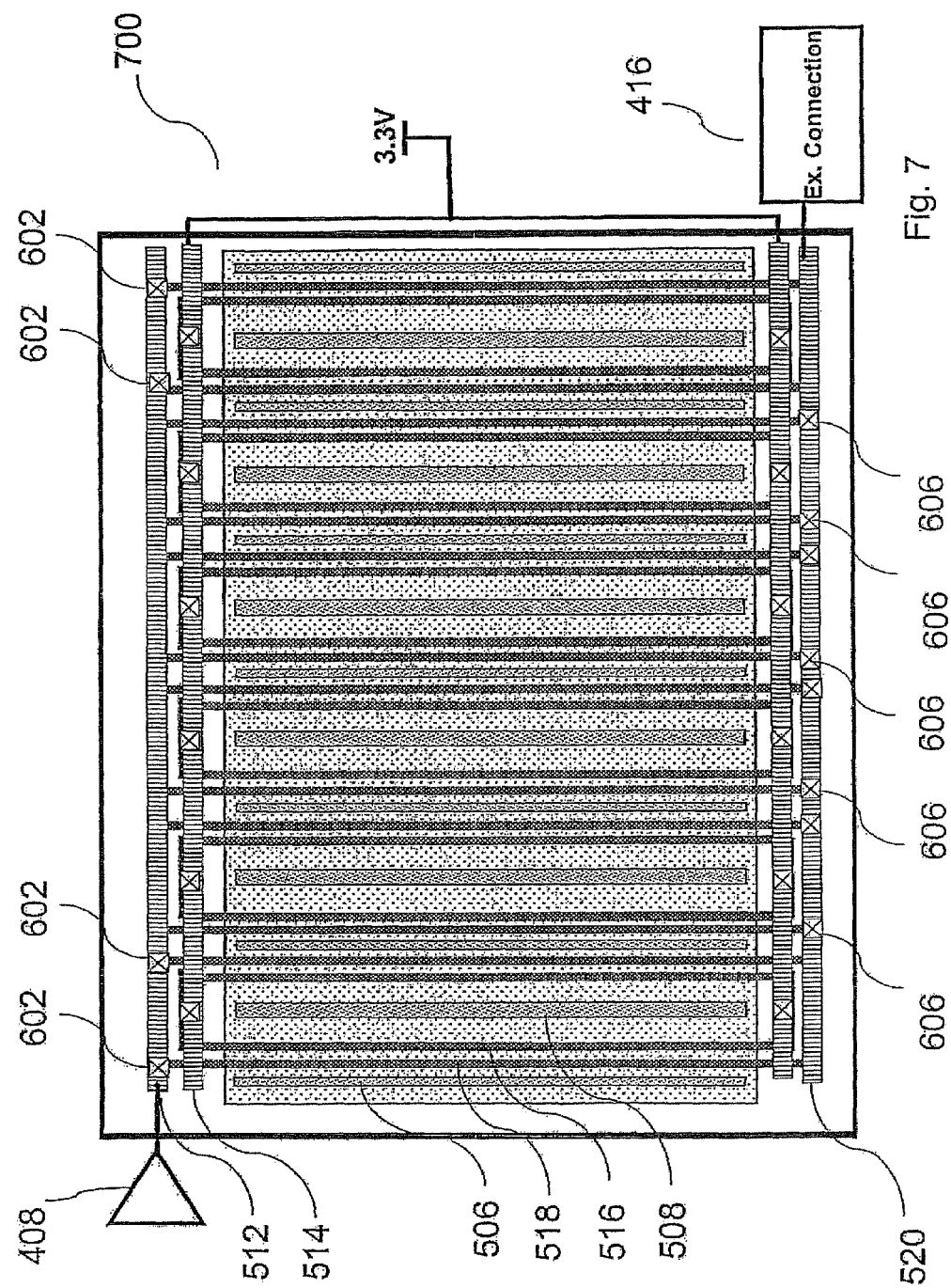
FIG. 7 illustrates a layout of a portion of the basic I/O cell with a predetermined number of connections made to certain feature components.

FIG. 7 illustrates the final layout 700 for the portion of the I/O cell after the basic cell and the connection template have been merged into an I/O cell design file. When merged, the connections 602 connect two pairs of the gates to the pre-driver 408. These now have made connections to T2. The remaining eight connections at the bottom connect the gates of the finger group 414 with the external connection 416.

The present invention as described above thus provides an improved method for designing I/O cells for use in semiconductor ICs. Various benefits are achieved over conventional approaches. For instance, the disclosed method reduces the design cycle-time as well as circuit-library maintenance and update effort.

The above disclosure provides many different embodiments, or examples, for implementing different features of the invention. Specific examples of components, and processes are described to help clarify the invention. These are, of course, merely examples and are not intended to limit the invention from that described in the claims. For example, the connection points can be via, contacts, or any other entities that make connections.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for preparing an I/O cell library based on a basic cell for designing an integrated circuit, comprising:
   designing a basic cell based on a predetermined basic design requirement, the basic cell having one or more components needed for designing one or more I/O cells;
   extracting all programmable connection points available on the basic cell on which connections can be made or removed on an as-needed basis to include or exclude one or more components; and
   identifying one or more sets of programmable feature connection points from the extracted programmable connection points based on one or more I/O cell features, the programmable connection points and feature connection points to be connected by a via layer having vias for connecting a first pattern on a first layer having a portion of the basic cell to a second pattern on a second layer;
   wherein the I/O cell library helps to dynamically generate a desired I/O cell based on a predetermined configuration requirement.

2. The method of claim 1 further comprising generating one or more feature templates, each having a subset of programmable connection points thereon for providing a predetermined I/O cell feature.

3. The method of claim 2 wherein the configuration requirement includes a driving strength requirement and one or more other predetermined I/O cell features.

4. The method of claim 3 further comprising generating a design file for the desired I/O cell.

5. The method of claim 4 further includes:
   selecting one or more feature templates based on the configuration requirement;
   modifying the programmable connection points on the selected feature templates so that the programmable connection points placed on the basic cell to integrate one or more components needed satisfy the configuration requirement; and
   creating the design file after the programmable connection points have been placed on the basic cell.

6. The method of claim 1 further comprising generating one or more connection templates, each having a subset of the programmable connection points thereon for providing a predetermined I/O cell, the predetermined I/O cell having a predetermined configuration and being one of a plurality of I/O cell variations based on the basic cell.

7. The method of claim 6 further comprising selecting one of the generated connection templates to create the desired I/O cell if a configuration requirement thereof matches the configuration of the selected connection template.

8. The method of claim 7 further comprising generating a design file for the desired I/O cell.

9. The method of claim 1 further comprising placing one or more programmable connection points dynamically on the basic cell based on a configuration requirement for the desired I/O cell, the configuration requirement including at least one I/O cell feature.

10. The method of claim 1 wherein the I/O cell features include a driving strength requirement.

11. The method of claim 1 wherein the I/O cell features include requirements for providing at least one feature in the group consisting of a pure input cell, pure output cell, bi-directional cell, at least one slew rate control circuit, pull-up circuit, pull-down circuit, input enable circuit, bus holder circuit, and Schmitt trigger circuit.

12. The method of claim 1, wherein the second pattern on the second layer is to be provided for connecting patterns on the first layer to each other.

13. A computer readable storage medium having computer program code stored therein, such that when the computer program code is executed by a processor, the processor performs a method for preparing an I/O cell library based on a basic cell for designing an integrated circuit, comprising instructions for:
    designing a basic cell based on a predetermined basic design requirement, the basic cell having one or more components needed for designing one or more I/O cells;
    extracting all programmable connection points available on the basic cell on which connections can be made or removed on an as-needed basis to include or exclude one or more components; and
    identifying one or more sets of programmable feature connection points from the extracted programmable connection points based on one or more I/O cell features, the programmable connection points and feature connection points to be connected by a via layer having vias for connecting a first pattern on a first layer having a portion of the basic cell to a second pattern on a second layer;
    wherein the I/O cell library helps to dynamically generate a desired I/O cell based on a predetermined configuration requirement.

14. The computer readable storage medium of claim 13 wherein the storage medium is encoded with further instructions for generating one or more feature templates, each having a subset of programmable connection points thereon for providing a predetermined I/O cell feature.

15. The computer readable storage medium of claim 14 wherein the storage medium is encoded with further instructions for generating a design file for the desired I/O cell.

16. The computer readable storage medium of claim 15 wherein the storage medium is encoded with further instructions for:
    selecting one or more feature templates based on the configuration requirement;
    modifying the programmable connection points on the selected feature templates so that the programmable connection points placed on the basic cell to integrate one or more components needed satisfy the configuration requirement; and
    creating the design file after the programmable connection points have been placed on the basic cell.

17. The computer readable storage medium of claim 13 wherein the storage medium is encoded with further instructions for generating one or more connection templates, each having a subset of the programmable connection points thereon for providing a predetermined I/O cell, the predetermined I/O cell having a predetermined configuration and being one of a plurality of I/O cell variations based on the basic cell.

18. The computer readable storage medium of claim 17 wherein the storage medium is encoded with further instructions for selecting one of the generated connection templates to create the desired I/O cell if a configuration requirement thereof matches the configuration of the selected connection template.

19. The computer readable storage medium of claim 13 wherein the storage medium is encoded with further instructions for placing one or more programmable connection points dynamically on the basic cell based on a configuration requirement for the desired I/O cell, the configuration requirement including at least one I/O cell feature.

20. The computer readable storage medium of claim 13 wherein the I/O cell features include requirements for providing at least one feature in the group consisting of a pure input cell, pure output cell, bi-directional cell, at least one slew rate control circuit, pull-up circuit, pull-down circuit, input enable circuit, bus holder circuit, driving strength, and Schmitt trigger circuit.

* * * * *